(12) United States Patent
Hung

(10) Patent No.: US 7,193,534 B2
(45) Date of Patent: Mar. 20, 2007

(54) APPARATUS AND METHOD FOR IMPROVING RESOLUTION OF OPTICAL ENCODER

(75) Inventor: Hao-Feng Hung, Taoyuan (TW)

(73) Assignee: BenQ Corporation, Taoyuan (TW)

( * ) Notice: Subject to any disclaimer, the term of this patent is extended or adjusted under 35 U.S.C. 154(b) by 0 days.

(21) Appl. No.: 11/254,453

(22) Filed: Oct. 20, 2005

(65) Prior Publication Data

US 2006/0087455 A1 Apr. 27, 2006

(30) Foreign Application Priority Data

Oct. 22, 2004 (TW) .............................. 93132111 A

(51) Int. Cl.
*H03M 1/22* (2006.01)
(52) U.S. Cl. ....................................................... 341/13
(58) Field of Classification Search ............... 341/1–17
See application file for complete search history.

(56) References Cited

U.S. PATENT DOCUMENTS 5,506,579 A * 4/1996 Spaulding ..................... 341/11
6,355,972 B1 3/2002 Snyder
6,963,064 B2 * 11/2005 Updegrave ............. 250/231.13

* cited by examiner

*Primary Examiner*—Brian Young
(74) *Attorney, Agent, or Firm*—Hoffman, Warnick & D'Alessandro, LLC

(57) ABSTRACT

The invention provides an interpolation apparatus for improving the resolution of an optical encoder. The optical encoder outputs an encoding signal, and the encoding signal corresponds to a first resolution. The interpolation apparatus comprises a comparing circuit and a lookup table circuit. The comparator receives the encoding signal and produces a plurality of comparison signals. The lookup table circuit receives a plurality of comparison signals and produces an outputted signal, wherein the outputted signal corresponds to second resolution. The second resolution is greater than the first resolution.

18 Claims, 10 Drawing Sheets

| LUTA $B_1B_2$ \ $A_1A_2$ | 0 0 | 0 1 | 1 1 | 1 0 |
|---|---|---|---|---|
| 0 0 | 0 | 0 | 1 | × |
| 0 1 | 1 | × | 1 | × |
| 1 1 | 1 | 0 | 0 | × |
| 1 0 | × | × | × | × |

$$LUTA = A_1\overline{B_1} + \overline{A_1}\,\overline{A_2}\,B_2$$

| LUTB $B_1B_2$ \ $A_1A_2$ | 0 0 | 0 1 | 1 1 | 1 0 |
|---|---|---|---|---|
| 0 0 | 1 | 0 | 0 | × |
| 0 1 | 1 | × | 1 | × |
| 1 1 | 0 | 0 | 1 | × |
| 1 0 | × | × | × | × |

$$LUTB = A_1 B_2 + \overline{A_1}\,\overline{A_2}\,\overline{B_1}$$

FIG. 4C

APPARATUS AND METHOD FOR IMPROVING RESOLUTION OF OPTICAL ENCODER

BACKGROUND OF THE INVENTION

1. Field of the Invention

The present invention relates to an interpolation apparatus for improving the resolution; more particularly, the present invention relates to an interpolation apparatus for improving the resolution of an optical encoder.

2. Description of the Prior Art

The optical encoder of the prior art generates a sine output wave with an optimal phase difference of 90 degrees and duty cycles consisting 50% positive and negative cycles, when it couples with a code strip or code wheel corresponding to the resolution.

Please refer to FIG. 1. FIG. 1 is a schematic diagram illustrating the sine output wave 8 generated based on the corresponding code strip 6 of the prior art. The code strip 6 of the prior art has a plurality of blocks with black and white color alternating with each other. The oblique line area on the code strip 6 in FIG. 1 represents the black block 7. The alternated black and white color pattern on the code strip 6 is detected by the light detection element, and the corresponding sine wave is outputted by the optical encoder. When the detection element detects the black block 7, the optical encoder outputs a low level value wave. On the contrary, if the detection element detects the white block, the optical encoder outputs a high level value wave. The output wave of this kind of optical encoder can be used for controlling the movement and speed of the motor.

As disclosed in U.S. Pat. No. 6,355,927, a signal generator generates signals of A, nA, B, nB, fractional A, and fractional B to improve the resolution of an optical encoder. However, this method must be used with complicated circuit to operate and to generate the six different signals mentioned above. Hence, this method is very complicated.

A general motor revolves by using signals to control the revolving movement and directions, and a signal must be an analog signal or a digital signal. By controlling the resolution of the analog signal and the digital signal, the revolving movement and directions of the motor can be precisely controlled. Because the digital signal is not continuous, it has a lower resolution. Hence, the digital signal is used to control the motor to revolve in larger scale. Because the analog signal is continuous, it has a higher resolution. Hence, the analog signal is used to control the motor to revolve in smaller scale. Therefore, the motor can be precisely controlled by the cooperation of the digital signal and the analog signal.

The main objective of the present invention is to improve the resolution of the digital signal to precisely control the motor.

SUMMARY OF THE INVENTION

One objective of the present invention is to provide an apparatus and a method for improving the resolution of an optical encoder.

Another objective of the present invention is to provide an apparatus and a method for improving the resolution of an optical encoder according to the digital signal generated by the optical encoder, without using special elements or complicated circuit to precisely control the motor.

The invention provides an interpolation apparatus for improving the resolution of an optical encoder. The optical encoder outputs an encoding signal, and the encoding signal corresponds to a first resolution. The interpolation apparatus includes a comparing circuit and a table-lookup circuit. The comparing circuit is used for receiving the encoding signal and for generating a plurality of comparison signals. The table-lookup circuit is used for receiving the plurality of comparison signals and for generating an output signal for controlling the motor to revolve, wherein the output signal corresponds to a second resolution that is higher than the first resolution.

The invention also provides a control apparatus for controlling the resolution of a motor when revolving. The control apparatus includes an optical encoder, a comparing circuit, and a table-lookup circuit. The optical encoder outputs an encoding signal, and the encoding signal corresponds to a first resolution to control the motor. The comparing circuit is used for receiving the encoding signal and for generating a plurality of comparison signals. The table-lookup circuit is used for receiving the plurality of comparison signals and for generating an output signal for controlling the motor to revolve, wherein the output signal corresponds to a second resolution that is higher than the first resolution to control the motor.

The invention provides an apparatus and a method for improving the resolution of an optical encoder, so as to improve the resolution of the digital signal originally generated by the optical encoder, such that the application of the digital signal outputted by the optical encoder will not be limited by the original value designed in the optical encoder. Hence, comparing with the prior art, the invention can improve and further make use of the resolution of the digital signal originally outputted by the optical encoder without using any special control chip or complicated circuit.

The advantage and spirit of the invention could be better understood by the following recitations together with the appended drawings.

BRIEF DESCRIPTION OF THE APPENDED DRAWINGS

Figure 4A:
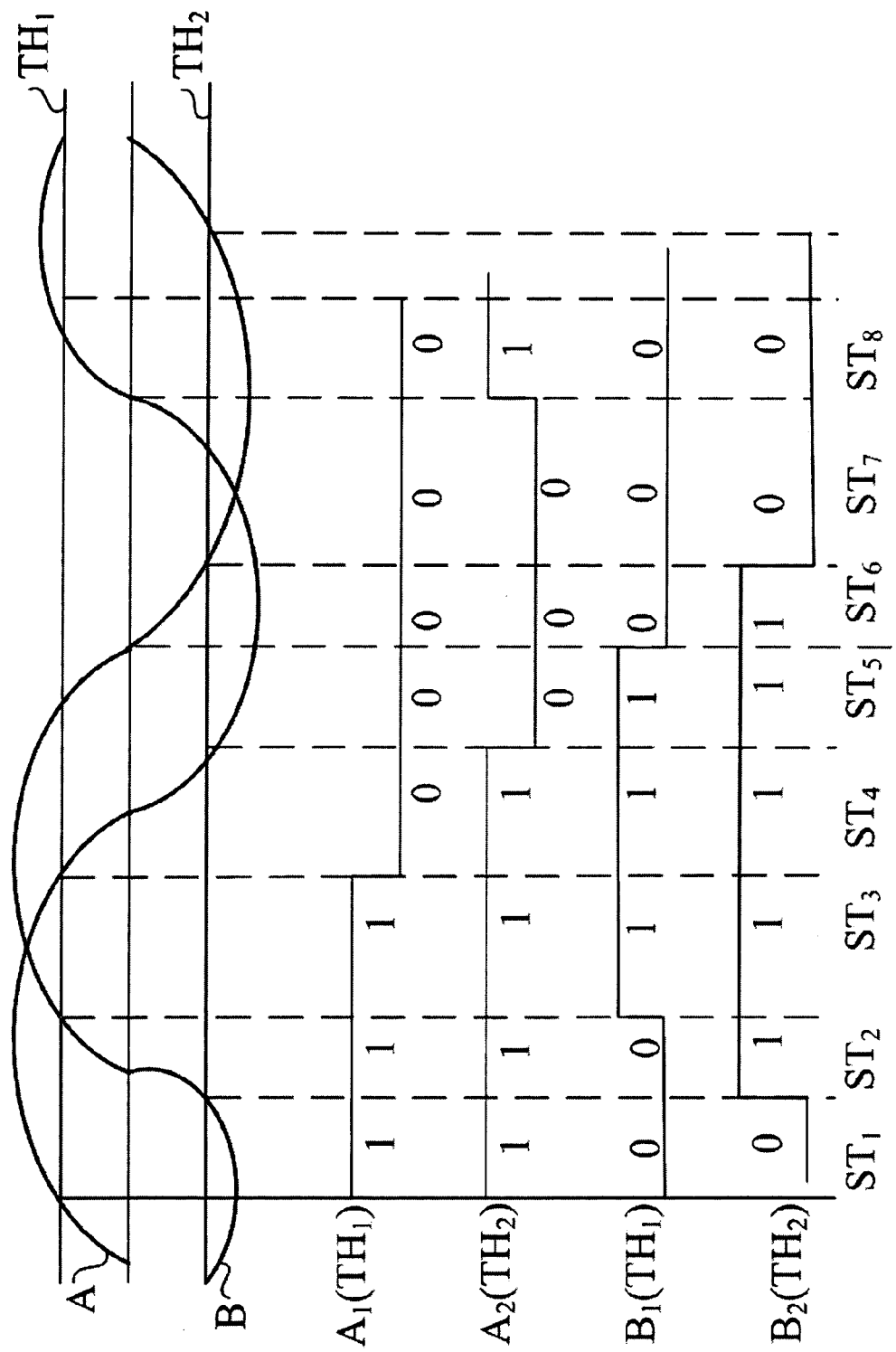
Figure 4B:
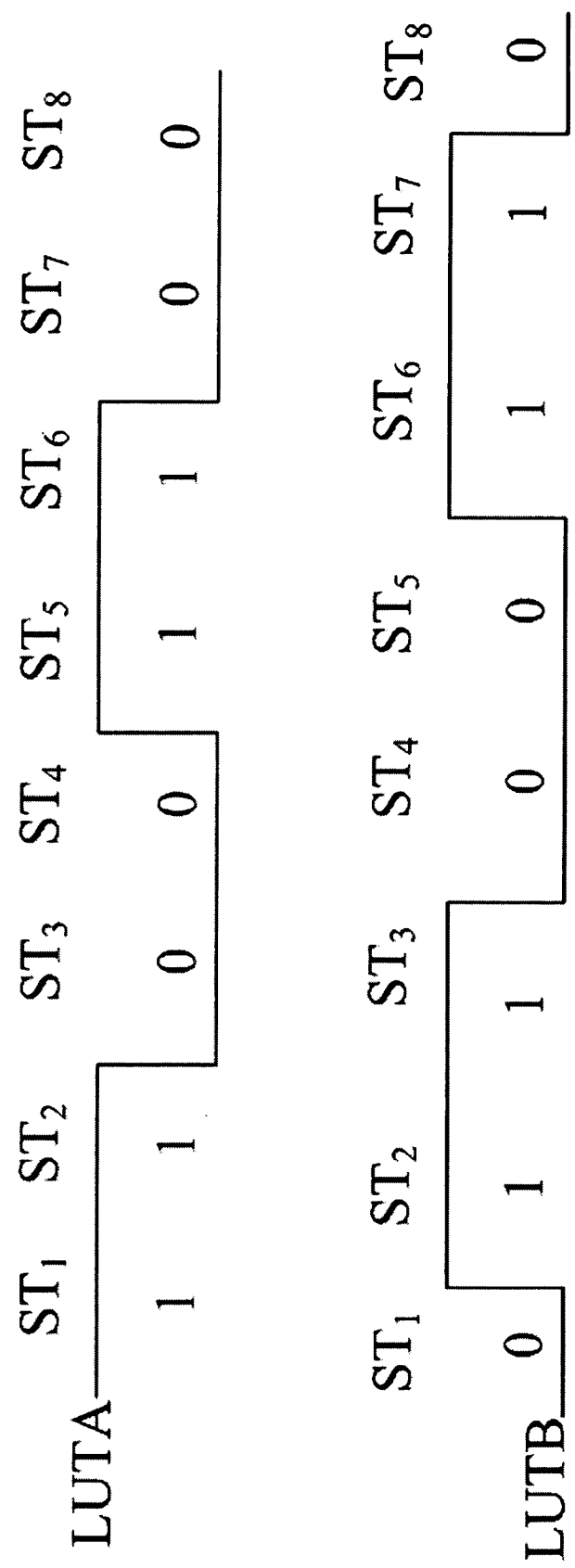

FIGS. 4A, 4B, and 4C are schematic diagrams illustrating the generating process of the table-lookup circuit.

Figure 5:
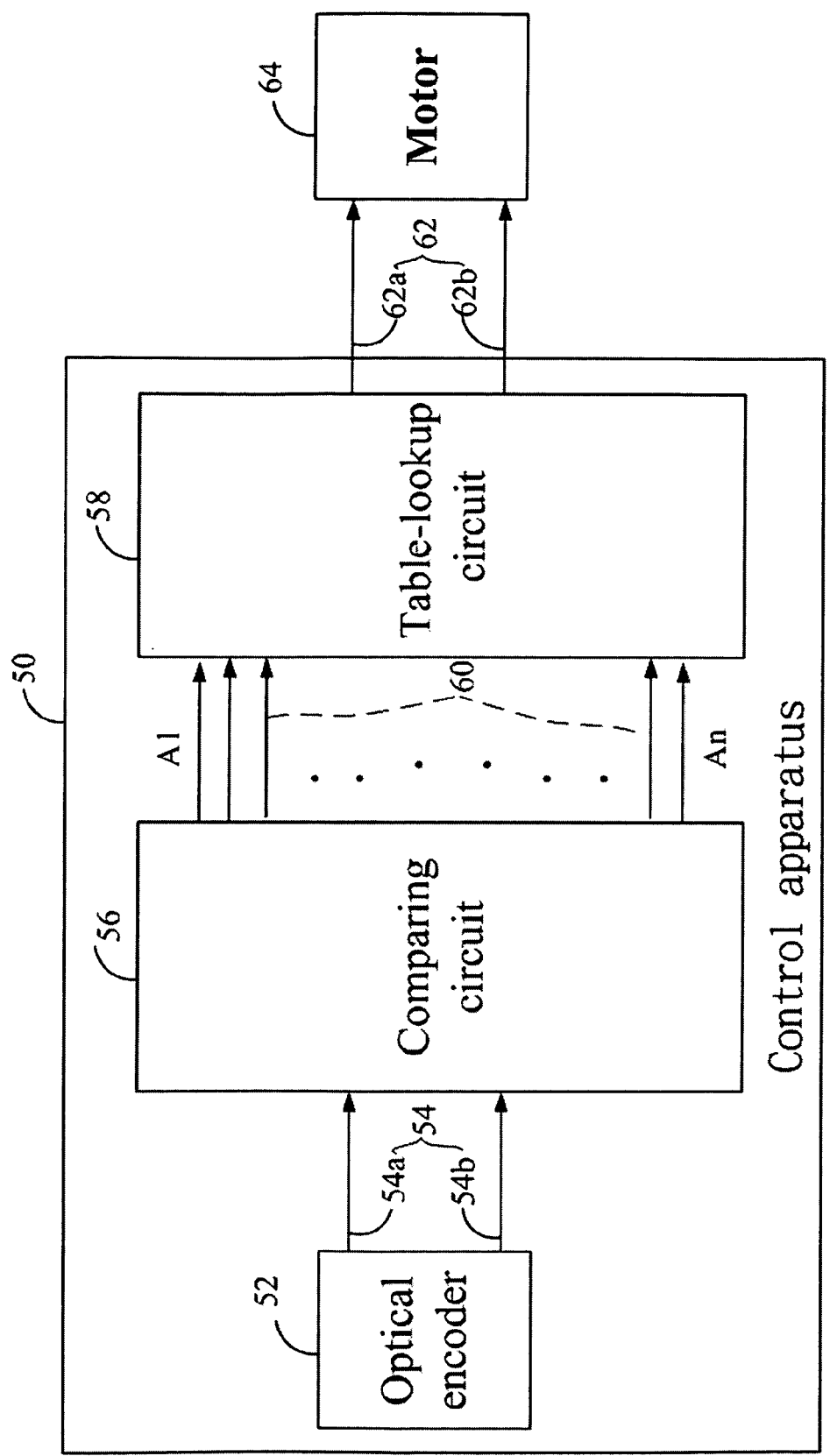

FIG. 5 is a system block diagram of the control apparatus of the present invention.

Figure 6:
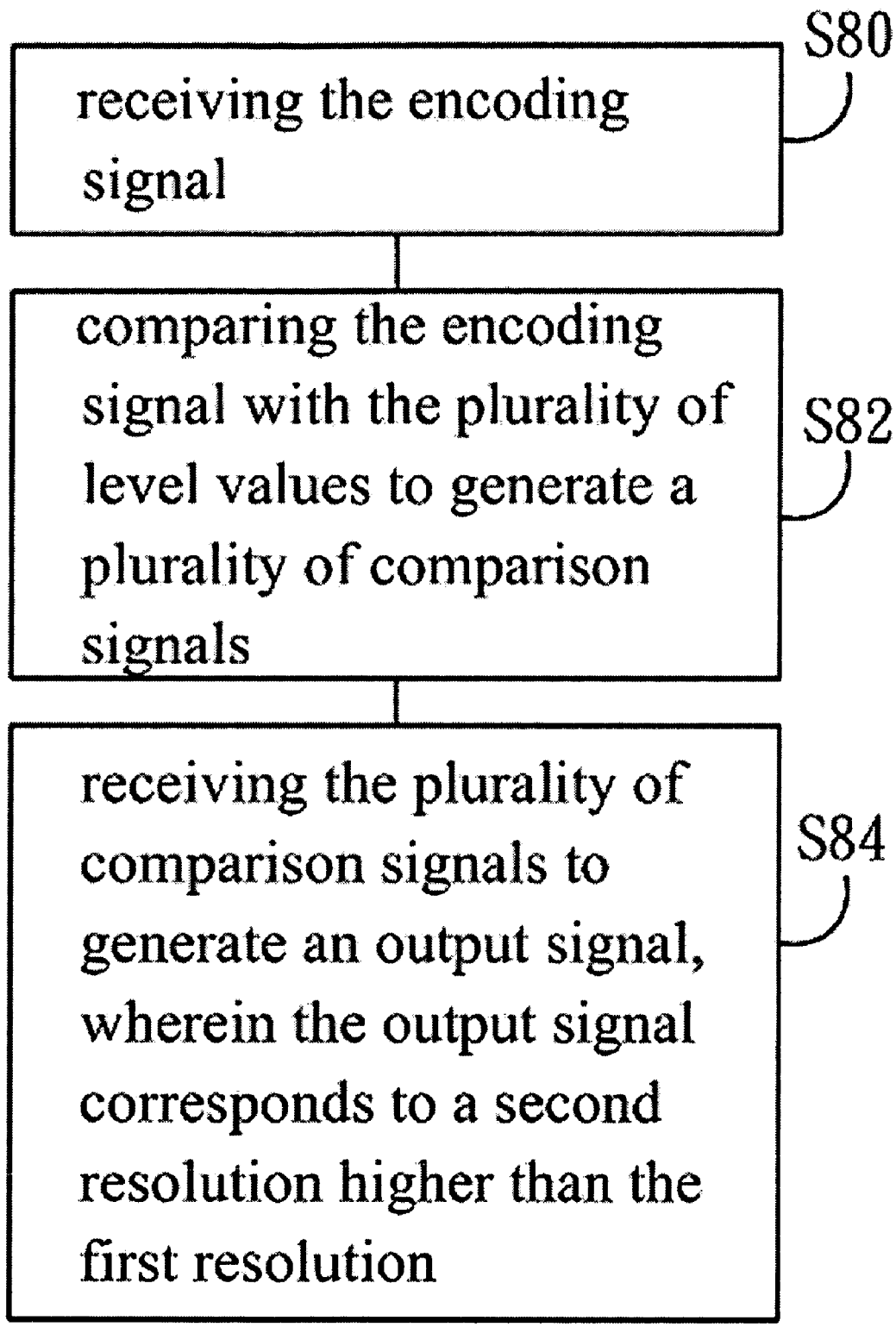

FIG. 6 is a flowchart illustrating the method for improving the resolution of an optical encoder.

Figure 7:
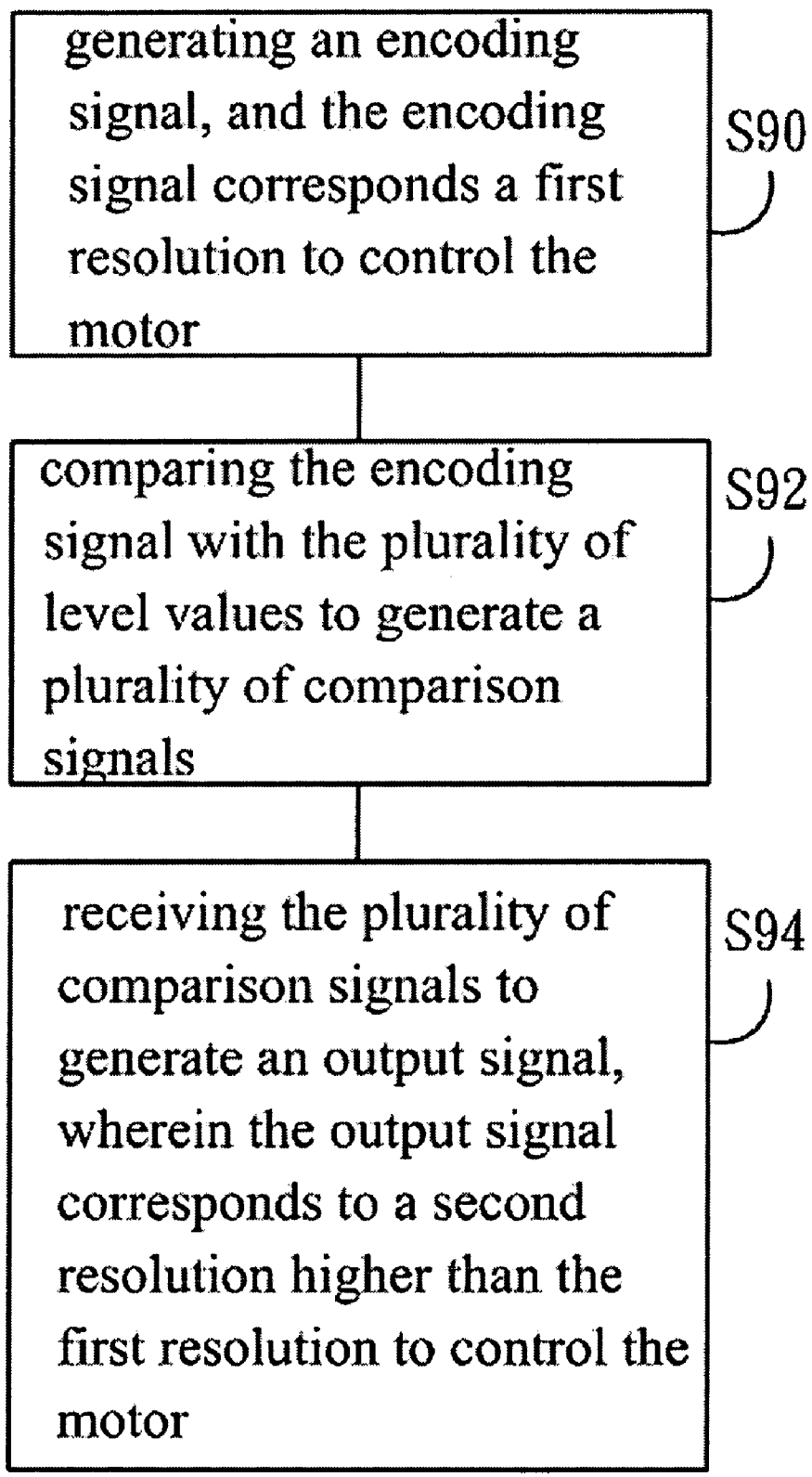

FIG. 7 is a flowchart illustrating the method for controlling the resolution of a motor when revolving

DETAILED DESCRIPTION OF THE INVENTION

Figure 1:
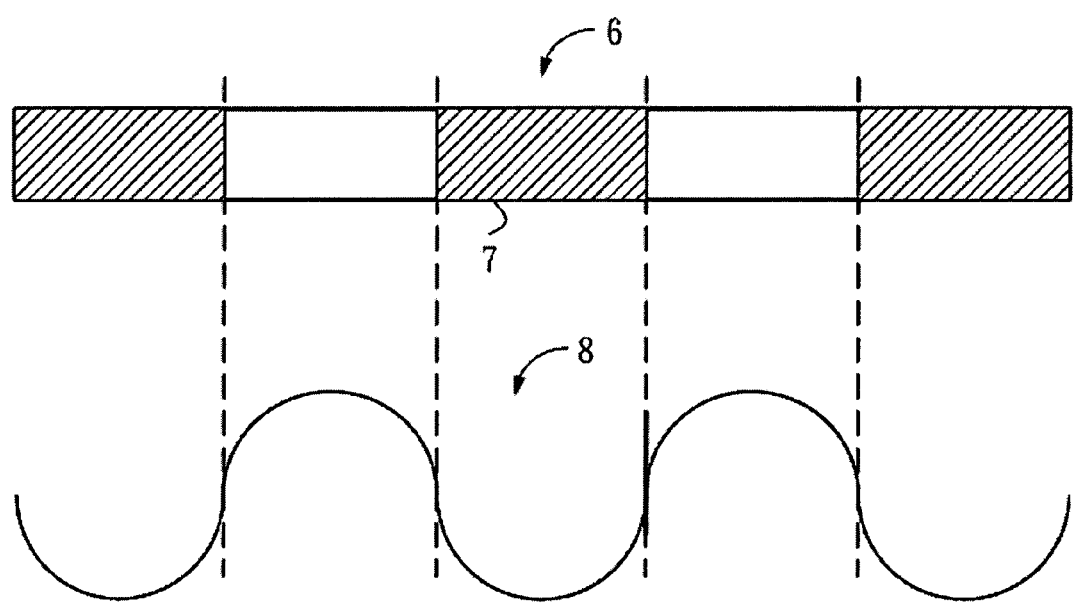
FIG. 1 is a schematic diagram illustrating the output wave of the digital signal generated based on the corresponding code strip
Figure 2:
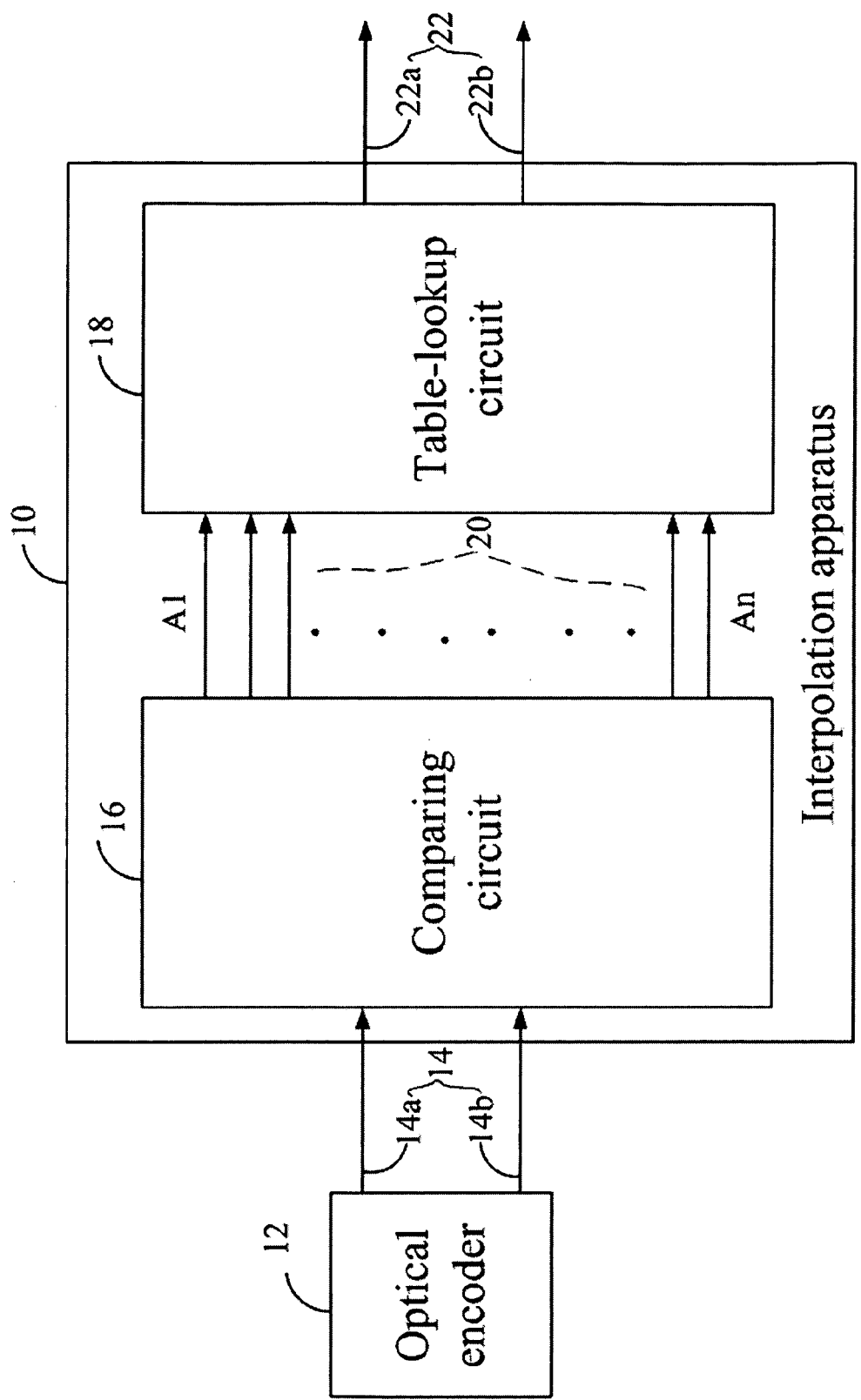
FIG. 2 is a system block diagram illustrating an interpolation apparatus for improving the resolution of an optical encoder according to the invention.

Please refer to FIG. 2. FIG. 2 is a system block diagram illustrating an interpolation apparatus 10 for improving the resolution of an optical encoder according to the invention. The invention provides an interpolation apparatus 10 for improving the resolution of an optical encoder 12. The optical encoder 12 outputs an encoding signal 14 corresponding to a first resolution. The encoding signal 14 includes a first phase signal 14a and a second phase signal 14b, wherein the phase difference between the first phase signal 14a and the second phase signal 14b is 90 degree.

The interpolation apparatus 10 includes a comparing circuit 16 and a table-lookup circuit 18. The comparing circuit 16 is used for receiving the encoding signal 14. The comparing circuit 16 compares the code r14 and a plurality of level value to generate the plurality of comparison signals 20.

Figure 3A:
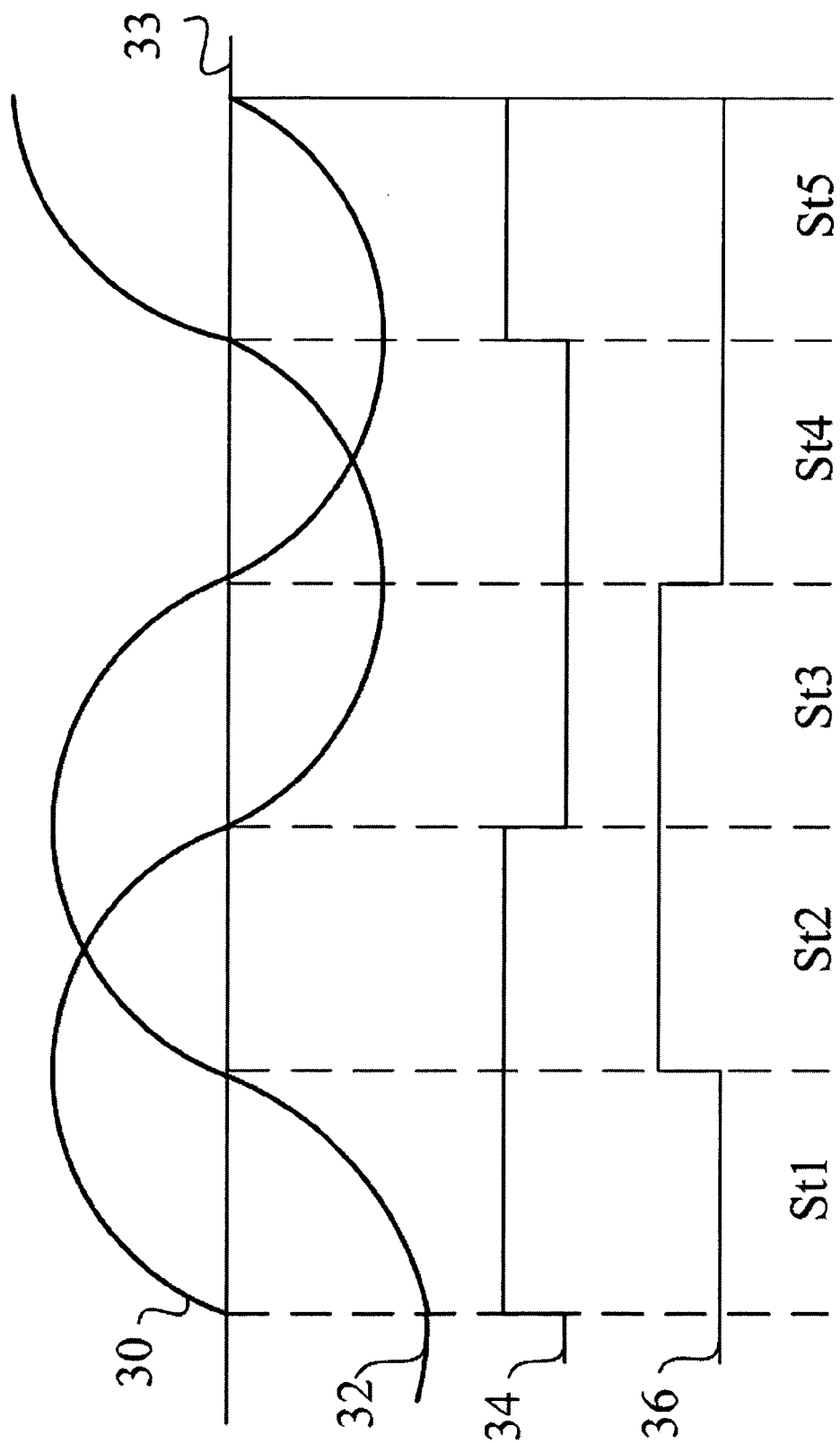
FIG. 3A is a schematic diagram illustrating the generating process of the comparison signal.
Figure 3B:
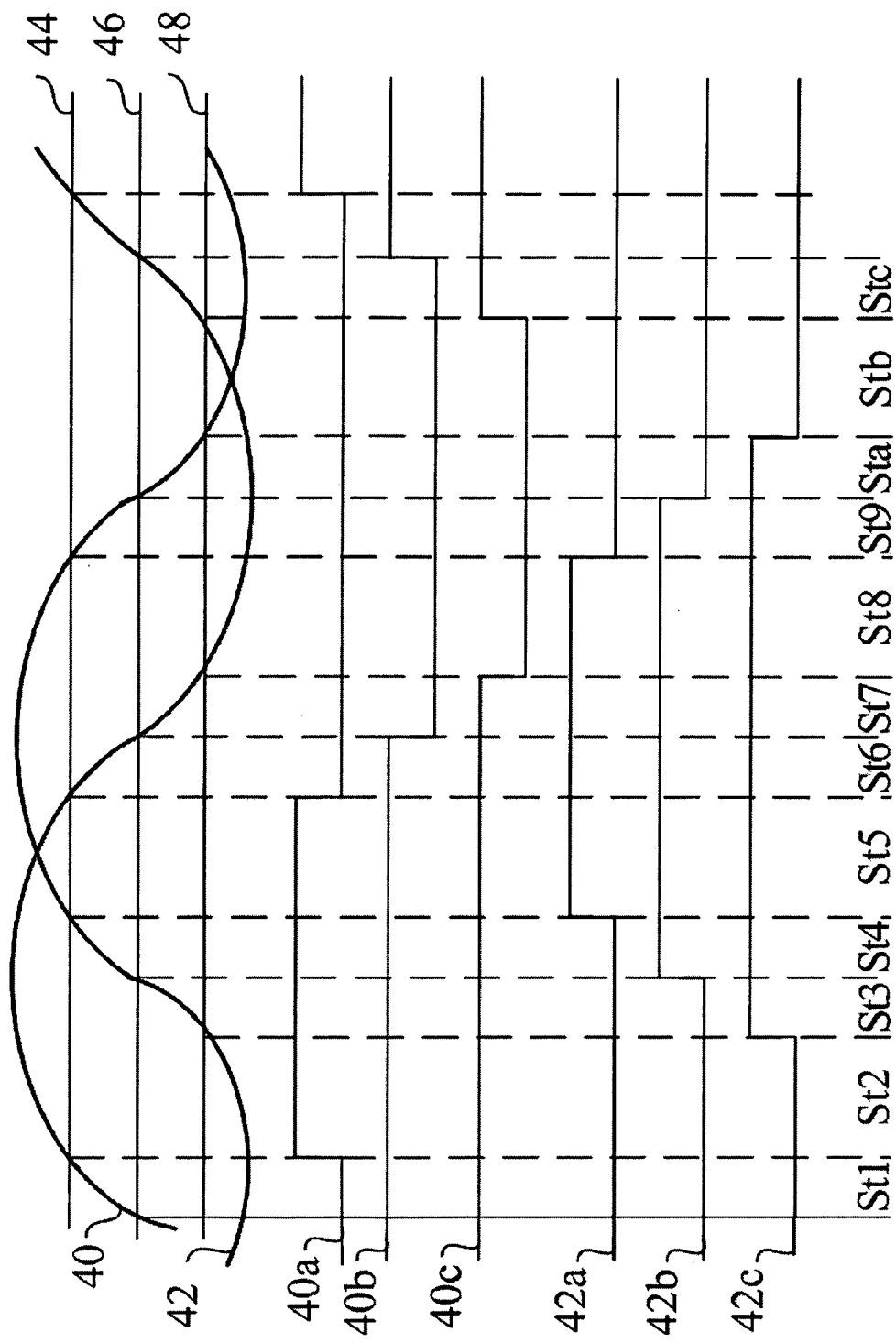
FIG. 3B is a schematic diagram illustrating the generating process of the comparing signal using three level values.

Please refer to FIG. 3A. FIG. 3A is a schematic diagram illustrating the generating process of the comparison signal. As shown in FIG. 3A, after the first phase signal 30 and the second phase signal 32 are compared with the level value 32, a first corresponding comparison signal 34 and a corresponding second comparison signal 36 are generated respectively, wherein the first comparison signal 34 corresponds to the first phase signal 30, and the second comparison signal 36 corresponds to the second phase signal 32. By using this method, it is known that when using a level value in the comparing process, different phase signals can respectively generate a corresponding comparing signal. Therefore, three different level values being used in the comparing process can respectively generate three corresponding comparing signals. As shown in FIG. 3B, FIG. 3B is a schematic diagram illustrating the generating process of the comparison signal 45 using three level values 44, 46, and 48. After the first phase signal 40 is compared with three level values 44, 46, and 48, three comparison signals 40a, 40b, and 40c are generated. With the same reason, after the second phase signal 42 is compared with three level values 44, 46, and 48, three comparison signals 42a, 42b, and 42c are generated.

The table-lookup circuit 18 is used for receiving the plurality of comparison signals 20 and for generating an output signal 22. The table-lookup circuit 18 is generated by a K-map operation according to the plurality of comparison signals 20 and the output signal 22.

The generating process of the table-lookup circuit is illustrated below. Please refer to FIG. 4A, FIG. 4B, and FIG. 4C. FIG. 4A, FIG. 4B, and FIG. 4C are schematic diagrams illustrating the generating process of the table-lookup circuit. As shown in FIG. 4A, according to a preferred embodiment of the present invention using the above mentioned method, two level values TH1 and TH2 are used to compare, and four comparison signals A1(TH1), A2(TH2), B1(TH1), and B2(TH2) are respectively generated. As shown in FIG. 4B, two output signals are then set up as LUTA and LUTB. As shown in FIG. 4C, two logical expressions $LUTA=A_1\overline{B_1}+\overline{A_1}A_2B_2$ and $LUTB=A_1B_2+\overline{A_1}A_2\overline{B_1}$ are generated by a K-map operation according to the four comparison signals A1(TH1), A2(TH2), B1(TH1), B2(TH2), and two output signal LUTA and LUTB, thus generating the table-lookup circuit.

The output signal 22 includes a first output signal 22a and a second output signal 22b. The frequencies of the first output signal 22a and second output signal 22b are higher than the frequency of the encoding signal 14. The output signal 22 corresponds to a second resolution that is higher than the first resolution.

Besides, after comparing with the three level values, the status of the phase signals can be added, and the type of the output signal is then set up by the user to generate the table-lookup circuit, thus enhancing the frequency of the phase signals. Please refer to FIG. 3B. After comparing with level values, the cycle time of the original phase signal can be divided to 12statuses (St1, St2, St3 . . . Stc). The table-lookup circuit with triple frequency can be generated according to the 12 statuses mentioned above and the output signals shown in FIG. 4B. The table-lookup circuit can be utilized to generate a triple frequency output signal, thus improving the resolution of the digital signal.

Please refer to FIG. 5. FIG. 5 is a system block diagram of the control apparatus 50 of the present invention. The present invention is a control apparatus 50 for controlling the resolution of a motor 64 when revolving. The control apparatus 50 includes an optical encoder 52, a comparing circuit 56, and a table-lookup circuit 58.

The optical encoder 52 is used for outputting an encoding signal 54, and the encoding signal 54 corresponds to a first resolution to control the motor 64. The encoding signal 54 includes a first phase signal 54a and a second phase signal 54b, and the phase difference between the first phase signal 54a and the second phase signal 54b is 90 degree. In an embodiment, the motor 64 is a direct current motor. The comparing circuit 56 is used for receiving the encoding signal 54 and for generating a plurality of comparison signals 60 by comparing the encoding signal 54 with the plurality of level values. The table-lookup 58 circuit is used for receiving the plurality of comparison signals 60 and for generating an output signal 62, wherein the table-lookup circuit 58 is generated by a K-map operation according to the plurality of comparison signals 60 and the output signal 62.

The output signal 62 is used for controlling the revolving motion of the motor 64; the output signal 62 includes a first output signal 62a and a second output signal 62b, and the frequencies of the first output signal 62a and second output signal 62b are higher than the frequency of the encoding signal 54. The output signal 62 corresponds to a second resolution that is higher than the first resolution to control the motor 64.

Please refer to FIG. 6. FIG. 6 is a flowchart illustrating the method for improving the resolution of an optical encoder. In the method for improving the resolution of an optical encoder according to a preferred embodiment of the invention, the optical encoder outputs an encoding signal corresponding to a first resolution. The method includes the following steps:

S80: receiving the encoding signal; the encoding signal comprises a first phase signal and a second phase signal, and the phase difference between the first phase signal and the second phase signal is 90 degree.

S82: comparing the encoding signal with the plurality of level values to generate a plurality of comparison signals.

S84: receiving the plurality of comparison signals to generate an output signal, wherein the output signal corresponds to a second resolution that is higher than the first resolution Wherein the output signal includes a first output signal and a second output signal, the frequencies of the first and second output signals are higher than the frequency of the encoding signal.

Please refer to FIG. 7. FIG. 7 is a flowchart illustrating the method for controlling the resolution of a motor when revolving. In an embodiment of the present invention, the motor is a direct current motor. The method includes the following steps:

S90: generating an encoding signal, and the encoding signal corresponds to a first resolution to control the motor; the encoding signal comprises a first phase signal and a second phase signal, wherein the phase difference between the first phase signal and the second phase signal is 90 degree.

S92: comparing the encoding signal with the plurality of level values to generate a plurality of comparison signals; and S94: receiving the plurality of comparison signals to generate an output signal, wherein the output signal corresponds to a second resolution that is higher than the first resolution to control the motor.

The output signal includes a first output signal and a second output signal, and the frequencies of the first and second output signals are higher than the frequency of the encoding signal.

The apparatus for improving the resolution of an optical encoder of the present invention can generate a resolution higher than the encoding signal generated by the optical encoder. The apparatus for improving the resolution of an optical encoder of the present invention can be used for controlling a motor by generating a higher resolution of the output signal. Hence, comparing to the prior art, by using the apparatus and method for improving the resolution of the optical encoder, the encoding signal outputted by the optical encoder will not be limited by the original value designed in the optical encoder, and the improved resolution of the output signal can be used to control the movement of the motor when revolving. Hence, according to the original encoding signal generated by the optical encoder, the motor can be precisely controlled. The invention does not need any special control chip or complicated circuit.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An interpolation apparatus for improving the resolution of an optical encoder, the optical encoder outputting an encoding signal corresponding to a first resolution, said interpolation apparatus comprising:
    a comparing circuit for receiving the encoding signal and for generating a plurality of comparison signals; and
    a table-lookup circuit for receiving the plurality of comparison signals and for generating an output signal, wherein the output signal corresponds to a second resolution higher than the first resolution.

2. The interpolation apparatus of claim 1, wherein the encoding signal comprises a first phase signal and a second phase signal, and the phase difference between the first phase signal and the second phase signal is 90 degrees.

3. The interpolation apparatus of claim 1, wherein the comparing circuit compares the encoding signal with a plurality of level values to generate the plurality of comparison signals.

4. The interpolation apparatus of claim 1, wherein the output signal comprises a first output signal and a second output signal, and the frequencies of the first and second output signals are higher than the frequency of the encoding signal.

5. The interpolation apparatus of claim 4, wherein the table-lookup circuit is generated by a K-map operation according to the plurality of comparison signals and the output signal.

6. A control apparatus for controlling the resolution of a motor when revolving, said control apparatus comprising:
    an optical encoder for outputting an encoding signal, and the encoding signal corresponds to a first resolution to control the motor;
    a comparing circuit for receiving the encoding signal and for generating a plurality of comparison signals; and
    a table-lookup circuit for receiving the plurality of comparison signals and for generating an output signal for controlling the motor to revolve, wherein the output signal corresponds to a second resolution higher than the first resolution to control the motor.

7. The control apparatus of claim 6, wherein the encoding signal comprises a first phase signal and a second phase signal, and the phase difference between the first phase signal and the second phase signal is 90 degrees.

8. The control apparatus of claim 6, wherein the comparing circuit compares the encoding signal with a plurality of level values to generate the plurality of comparison signals.

9. The control apparatus of claim 6, wherein the output signal comprises a first output signal and a second output signal, and the frequencies of the first and second output signals are higher than the frequency of the encoding signal.

10. The control apparatus of claim 6, wherein the table-lookup circuit is generated by a K-map operation according to the plurality of comparison signals and the output signal.

11. The control apparatus of claim 6, wherein the motor is a direct current motor.

12. A method for improving the resolution of an optical encoder, the optical encoder outputting an encoding signal corresponding to a first resolution, said method comprising:
    (a) receiving the encoding signal;
    (b) comparing the encoding signal with a plurality of level values to generate a plurality of comparison signals; and
    (c) receiving the plurality of comparison signals to generate an output signal, wherein the output signal corresponds to a second resolution higher than the first resolution.

13. The method of claim 12, wherein the encoding signal comprises a first phase signal and a second phase signal, and the phase difference between the first phase signal and the second phase signal is 90 degrees.

14. The method of claim 12, wherein the output signal comprises a first output signal and a second output signal, and the frequencies of the first and second output signals are higher than the frequency of the encoding signal.

15. A method for controlling the resolution of a motor when revolving, said method comprising:
    (a) generating an encoding signal, and the encoding signal corresponds to a first resolution to control the motor;
    (b) comparing the encoding signal with a plurality of level values to generate a plurality of comparison signals; and
    (c) receiving the plurality of comparison signals to generate an output signal, wherein the output signal corresponds to a second resolution higher than the first resolution to control the motor.

16. The method of claim 15, wherein the encoding signal comprises a first phase signal and a second phase signal, and the phase difference between the first phase signal and the second phase signal is 90 degrees.

17. The method of claim 15, wherein the output signal comprises a first output signal and a second output signal, and the frequencies of the first and second output signals are higher than the frequency of the encoding signal.

18. The method of claim 15, wherein the motor is a direct current motor.

* * * * *